United States Patent [19]

Pasch

[11] Patent Number: 5,055,871
[45] Date of Patent: Oct. 8, 1991

[54] METHOD AND APPARATUS FOR ENHANCING ILLUMINATION UNIFORMITY IN WAFER STEPPERS USING PHOTOCHROMIC GLASS IN THE OPTICAL PATH

[75] Inventor: Nicholas F. Pasch, Redwood City, Calif.

[73] Assignee: LSI Logic Corporation, Milpitas, Calif.

[21] Appl. No.: 418,548

[22] Filed: Oct. 5, 1989

[51] Int. Cl.$^5$ .............................................. G03B 27/42
[52] U.S. Cl. ........................................ 355/53; 355/71; 355/80
[58] Field of Search ............................. 355/53, 71, 80

[56] References Cited

U.S. PATENT DOCUMENTS

| | | | |
|---|---|---|---|
| 2,420,636 | 5/1947 | Yule | 355/77 |
| 3,160,504 | 12/1964 | Montani | 355/77 |
| 3,436,353 | 4/1969 | Dreyer et al. | 350/130 |
| 3,441,346 | 4/1969 | Naidich et al. | 355/71 |
| 3,598,471 | 8/1971 | Baldwin et al. | 355/71 |
| 3,680,956 | 8/1972 | Custer | 355/80 |
| 3,758,207 | 9/1973 | Letzer | 355/80 |
| 4,025,191 | 5/1977 | Seward | 355/71 |

Primary Examiner—Monroe H. Hayes
Attorney, Agent, or Firm—Gerald E. Linden; Michael D. Rostoker

[57] ABSTRACT

Enhanced uniformity of illumination is achieved in photolithography by interposing photochromic glass in the light path between the illuminator light source and a semiconductor wafer. In one embodiment of the invention, the photochromic glass is disposed immediately adjacent and before (upstream of) the mask. In another embodiment of the invention, the photochromic glass is disposed upstream of the mask, and an intermediate lens is disposed between the photochromic glass and the mask. In a still further embodiment of the invention, the photochromic glass is disposed in a reflector behind the illuminator light source. In other embodiments of the invention. The photochromic glass is disposed downstream of the mask. In yet another embodiment of the invention, the photochromic glass is exposed by two or more copies of a mask on a reticle to effect averaging. The photochromic glass is then used as a virtual mask to expose the wafer. Each of the described embodiments has its own advantages. Method and apparatus are disclosed.

30 Claims, 1 Drawing Sheet

METHOD AND APPARATUS FOR ENHANCING ILLUMINATION UNIFORMITY IN WAFER STEPPERS USING PHOTOCHROMIC GLASS IN THE OPTICAL PATH

TECHNICAL FIELD OF THE INVENTION

The present invention relates to manufacturing techniques for semiconductor devices and, more particularly, to optical or photolithographic techniques.

BACKGROUND OF THE INVENTION

Photolithography is a common technique employed in the manufacture of semiconductor devices. Typically, a semiconductor wafer is coated with a layer of light sensitive resist material (photoresist). Using a patterned mask or reticle, the wafer is exposed to projected light, typically actinic light, which manifests a photochemical effect on the photoresist, which is ultimately chemically etched away, leaving a pattern of photoresist "lines" on the wafer corresponding to the pattern on the mask or reticle. A simplified diagram of a photolithographic apparatus is illustrated in FIG. 1, discussed hereinafter.

One type of mask used in the photolithography process is a chromed glass or quartz plate bearing the pattern to be projected onto the photoresist layer. Light is projected through the mask, and those areas of the mask which are not chromed allow the light to expose the photoresist, while those areas of the mask which are chromed prevent the light from exposing the photoresist. The exposed areas of the photoresist resist chemical etching.

A typical photolithography apparatus is the Ultratech Stepper Model 900 projection stepper. A projection stepper is a device that presents a sequence of masks (on a reticle) between the light source and the wafer.

Commonly-owned U.S. Pat. No. 4,652,134, entitled MASK ALIGNMENT SYSTEM, discloses a system for aligning a semiconductor wafer with a mask bearing a pattern to be formed on the wafer, and is incorporated by reference herein.

The major causes of nonuniformity of line widths in semiconductor wafers are nonuniformity of illumination, and "intrinsic" materials qualities having to do with contrast. The illumination uniformity of photolithographic apparatus will often set a limit to how small a feature, such as a line, can be imaged in a manufacturing environment. Current systems have illumination uniformities of plus or minus 1–3%. In other words, illumination nonuniformity represents approximately a 6% error source, an overwhelming amount when one is designing against an "error budget" that may only be 10%. This is a very significant excursion for a very high contrast material. Furthermore, these illumination error figures tend to be optimistic, and represent what the bulb manufacturer obtained under ideal conditions. Ultimately, illumination nonuniformity establishes a lower limit on any line width obtainable using photolithographic techniques, consequently limiting the number of devices that can practically reside on a wafer of given size.

Various techniques have been proposed and practiced for increasing photolithographic illumination uniformity. These include the use of uniformizers (light homogenizers), such as "fly's-eye" lenses, light pipes and fiber optic bundles. Fly's-eye lenses, for example, create an overlapping matrix of images of a light source. Light pipes and fiber optic bundles rely on internal reflections to uniformize the light from the light source. However, these techniques appear to have reached a limit to their effectiveness, repeatability and practicality.

DISCLOSURE OF THE INVENTION

It is therefore an object of the present invention to enhance illumination uniformity in photolithographic apparatus, such as wafer steppers.

It is a further object of the invention to provide retrofittable apparatus for improving illumination uniformity in existing photolithographic apparatus.

It is a further object of the present invention to improve the linewidth uniformity of semiconductor wafers processed by photolithographic techniques.

It is a further object of the present invention to enable photolithographic apparatus to be used at finer linewidths.

It is a further object of the present invention to lower the contrast in photolithographic apparatus.

It is a further object of the present invention to enhance photolithographic averaging techniques.

According to the invention, enhanced uniformity of illumination is achieved in photolithography by interposing photochromic glass in the light path between the illuminator light source and a semiconductor wafer.

In one embodiment of the invention, the photochromic glass is disposed immediately adjacent and upstream in the light path before the mask. Typically, the photochromic glass and mask are at the common focal point of a condensor lens, associated with the illuminator light source, and a taking lens, which images the mask pattern onto the wafer.

In another embodiment of the invention, the photochromic glass is disposed upstream of the mask, and an intermediate lens is disposed between the photochromic glass and the mask. The photochromic glass is located at the common focal point of the condensing lens and the intermediate lens.

In a still further embodiment of the invention, the photochromic glass is disposed in a reflector behind the illuminator light source. While physically "behind" the light source, the photochromic glass is nevertheless disposed in the light path between the light source and the mask.

In another embodiment of the invention, the photochromic glass is disposed downstream of the mask to soften mask contrast.

In yet another embodiment of the invention, the photochromic glass is disposed downstream of the mask and is exposed without the wafer in place by two or more copies of a mask on a reticle to effect averaging. The photochromic glass is then used as a virtual mask to expose the wafer.

Other objects, features and advantages of the invention will become apparent in light of the following description thereof.

DETAILED DESCRIPTION OF THE INVENTION

Figure 1:
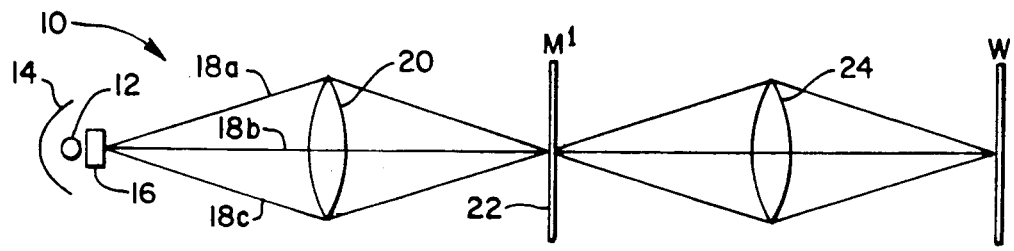
FIG. 1 is a simplified schematic representation of a prior art photolithographic apparatus.

FIG. 1 shows prior art photolithographic apparatus 10 for exposing a semiconductor wafer (W), more particularly a coating thereon, to light. An optical path is defined from left to right throughout FIGS. 1–4, as viewed. Prior to exposure, the semiconductor wafer (W) typically receives on its front surface a layer of photoreactive material (not shown), such as photoresist.

A light source 12 emits actinic light, and may be backed up by a reflector 14. Light emitted by the light source typically passes through a uniformizer 16, such as a "fly's eye" lens or a light pipe.

Light exiting the uniformizer 16 is represented by rays 18a, 18b and 18c, and passes through a condensor lens 20. The ray 18b represents the optical axis of the photolithographic apparatus. The light source 12, reflector 14, uniformizer 16 and condensor lens 20 form what is termed an "illuminator", which is often detachable as a unit from the photolithographic apparatus.

A mask 22 (M1) is disposed "downstream" of the condensor lens 20, at the focal plane (point) thereof. One type of mask used in photolithography is a chromed glass or quartz plate bearing a pattern to be projected onto the wafer (W). As will be discussed hereinafter, with reference to FIG. 4, a "reticle" contains multiple patterns to be projected onto the wafer, in some cases several copies of the same image, or mask.

Further downstream along the light path, the rays diverge from the mask, and pass through a "taking" (imaging) lens 24. Because of its imaging function, the taking lens 24 is of relatively high quality as compared with the condensor lens 20. The mask 22 is disposed at a common focal point for the two lenses 20 and 24.

A semiconductor wafer (W) is disposed at the "downstream" focal plane, or image plane, of the taking lens 24. Those areas of the mask (or reticle) which are not chromed allow the light to expose a photoreactive layer on the surface of the wafer (W), while those areas of the mask which are chromed (or otherwise opaquely patterned) prevent the light from exposing the photoreactive layer. The photoreactive layer is typically a photoresist material. The exposed areas of the photoresist resist chemical etching, and form circuit elements, such as resistors or "lines" (conductors) on the semiconductor wafer (W).

Various light tunnels, actinic shutters, high speed shutters and prisms may be interposed in the light path, as is well known, and are disclosed in the aforementioned commonly-owned U.S. Pat. No. 4,652,134, incorporated by reference herein.

Those skilled in the art to which the present invention pertains will recognize that a lithographic projection stepper includes a mechanism for positioning a sequence of masks (M1-Mn), such as may be contained on a single reticle, in the optical path of photolithographic apparatus, such as has been described with respect to FIG. 1.

Those skilled in the art to which the present invention pertains will also recognize that the various elements throught the drawing figures are exaggerated in dimension and spacing for the sake of illustrative clarity.

Figure 2:
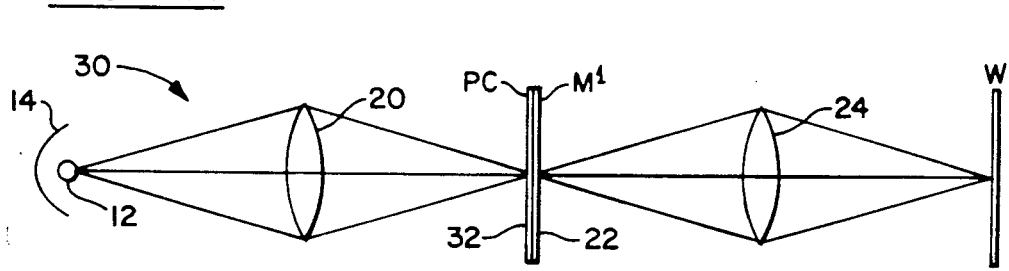
FIG. 2 is a simplified schematic representation of photolithographic apparatus according to the present invention.

FIG. 2 shows an embodiment of the photolithographic apparatus 30 of the present invention. As in the prior art photolithographic apparatus 10 discussed with respect to FIG. 1, the lithographic apparatus 30 includes a light source 12, optionally a reflector 14, a first (condensor) lens 20 and a second (taking) lens 24. A mask 22 is disposed between the two lenses 20 and 22 at the common focal plane thereof for exposing a semiconductor wafer (W) having a photoreactive layer to actinic light. A uniformizer (element 16 of FIG. 1) may be employed in the photolithographic apparatus of FIGS. 2–4, but has been omitted for the sake of illustrative clarity. Further, as discussed with respect to the photolithographic apparatus 10 of FIG. 1, various light tunnels, actinic shutters, high speed shutters and prisms may be interposed in the light path, as is known.

As shown in FIG. 2, a photochromic glass 32 is interposed in the optical path of the photolithographic apparatus 30 "upstream" (before) and in close proximity to the mask 22, so that, for practical purposes, the photochromic glass is also at the common focus of the two lenses 20 and 24. The photochromic glass 32 is preferably an optically flat plate, so that it is non-focusing.

In this and other "upstream" embodiments of the invention, discussed hereinafter, the interposition of the photochromic glass in the optical path between the light source and the mask will tend to uniformize the illumination field, i.e. the light passing through the mask and ultimately incident upon the wafer. In order to understand this result, it is necessary to understand the mechanism of photochromism, as applied to the present invention.

Photochromic glass, which is initially clear, responds to incident light by graying, and ultimately becomes opaque in relation to the duration and intensity of exposure, thickness of the glass and intrinsic characteristics of the glass. By way of definition, photochromic glass has a "response" characteristic, which describes the darkening of the glass in response to incident light, and a "memory" characteristic, which describes the clearing of the glass after exposure. The ability of photochromic glass to remain darkened in response to light once incident thereupon may be for minutes or tens of hours, depending upon such factors as the thickness of the glass and the history of exposure. Both the response and memory characteristics of photochromic glass may be specified, and appropriate photochromic glass having such specified characteristics is readily formulated.

Photochromic glass has become somewhat of a commmodity. An exemplary source of photochromic glass is the Corning Glass Company.

Digressing for a moment, various prior art techniques have attempted to address the inherent nonuniformity of illumination in photolithographic apparatus. For instance, in one "passive" technique, the illumination at the image plane (location of the wafer W) is mapped and the position of the light source is manually adjusted for the most uniform intensity distribution.

Photochromic glass, on the other hand, as employed in the present invention, responds to illumination nonuniformities "actively". Additionally, the response time of photochromic glass is of finite, predictable, specifiable duration. If the intensity of the light source should suddenly change, the photochromic glass will make a smooth, uniform transition in response to the new intensity, and will typically do so in a relatively short period of time. Furthermore, photochromic glass typically has a relatively long memory. In other words, although the photolithographic apparatus may not have been used for a relatively long period of time, the photochromic glass will still be making a proportional change based on its memory characteristics. While this may, at first blush, seem to be disadvantageous in that the glass will provide different transparity over time, lithographic apparatus (including wafer steppers) typically monitors intensity at the image plane with each new exposure of a wafer, so that any overall variations therein are compensated for by adjusting the exposure time. In other words, exposure time is typically controlled to an illumination (exposure) dose. Thus, while the photochromic glass interposed in the light path could account for up to a 50% loss of overall intensity, such a loss is readily compensated for by a corresponding increase in the exposure time. Further, the loss of overall intensity is entirely acceptable to achieve the object of uniformity of illumination at the image plane. Such a loss of light intensity to achieve an increase in uniformity is certainly better than having "plenty of nothing" (i.e., light of nonuniform, but higher, intensity).

Commercially-available photochromic glasses are particularly useful at the wavelengths commonly employed in photolithography, such as 436, 405, 365 or 313 nanometers. Commercially-available photochromic glasses tend to be more profoundly absorptive below 365 nanometers, unless used as a very thin piece of material. For photolithographic apparatus employing wavelengths in a different range, different photochromic glass materials are readily formulated.

By interposing a photochromic glass upstream of the mask in the light path, as discussed with respect to FIG. 2, and by realizing a consequent increase in illumination uniformity, line widths on the order of 0.4 to 0.8 microns, or finer, are much more readily attainable. (By "line widths" is meant the width of the photoreactive material remaining on the wafer after etching.) One could justifiably characterize the benefits of the present invention in this range of line widths as "critical". Aside from this inherent benefit, finer line widths allow for finer spacing between lines. For line widths above 1.0 microns, the effect of the photochromic glass is less critical, but is still beneficial.

In an alternate embodiment of the invention, not shown, the photochromic glass is placed upstream of the mask next to the condensor lens. For instance, in FIG. 2, the photochromic glass 32 would be placed next to the condensor lens 20, rather than immediately adjacent the mask 22. This would have the effect of antiapodizing the lens (aperture). The photochromic glass would absorb the lower frequencies (maximum energies) of light passing through the lens, and would enhance the higher frequency components of light passing through the lens, and ultimately through the mask. Hence, resolution of the system would be enhanced. Although there may be an adverse effect on the depth of focus, such would be an an acceptable tradeoff against increased resolution.

Figure 3:
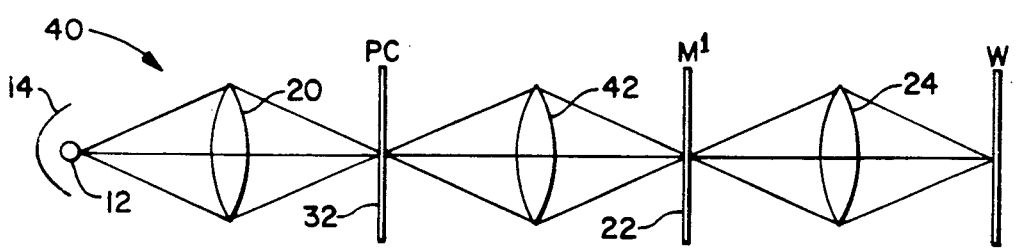
FIG. 3 is a simplified schematic representation of an alternate embodiment of photolithographic apparatus according to the present invention.

FIG. 3 shows an alternate embodiment of the photolithographic apparatus 40 of the present invention. In a manner similar to that discussed with respect to FIG. 2, the photolithography apparatus 40 includes a light source 12, optionally a reflector 14 and a condensor lens 20. However, whereas in the embodiment of FIG. 2 the both the photochromic glass 32 and the mask 22 were disposed at the focal plane of the condensor lens 20 (with the photochromic glass on the upstream side of the mask), in the embodiment of FIG. 3, only the photochromic glass (PC) is interposed at the focal point of the condensor lens 20, and the mask is disposed further downstream in the light path. Further, an intermediate collection optic (lens) 42 is disposed in the light path between the photochromic glass and the mask. More particularly, the photochromic glass 32 is disposed at the common focal point of the condensing lens 20 and the collection optic 42, and the mask 22 is disposed at the common focal point of the taking lens 24 and the collection optic 42. This would appear to be the preferred mode to employ the photochromic glass in the light path, due to the beneficial effects of separately focusing the light onto the photochromic glass and the mask, and is the preferred embodiment for an illuminator that is retrofittable to existing photolithographic apparatus. Such a retrofittable illuminator would include the light source 12, optionally the reflector 14, optionally a uniformizer (e.g., the uniformizer 16 of FIG. 1), the condensor lens 20, the photochromic glass 32, preferably mounted so that different photochromic glasses could be used in the illuminator, and the collection optic 42.

In another "upstream" embodiment of the invention, not shown, the photochromic glass would be placed into the reflector 14 in the illuminator. In this embodiment, a curved glass would be employed. Conceivably, the reflector itself could be formed of photochromic glass with a reflective coating on its back surface. This would have beneficial effects in and of itself, or in combination with the other embodiment of the invention and uniformizers of the prior art discussed above.

In all of the embodiments of the invention discussed above, interposing photochromic glass in the optical path of a photolithographic apparatus, upstream of the mask, has the benefit of uniformizing the intensity of the light. Many beneficial effects in semiconductor manufacture are realized thereby. Further, as discussed above, various other advantages are attributable to particular embodiments of the invention.

In the embodiments of the invention discussed below, the photochromic glass is disposed in the light path downstream of the mask.

In a first "downstream" embodiment of the invention, the photochromic glass is placed downstream of the mask. This embodiment is not illustrated, but could be envisioned as interchanging the positions of the mask and photochromic glass in FIG. 2. At first blush, this downstream placement of the photochromic glass would seem to have nothing but disadvantages in that it would evidently lower the modulation transfer function of the mask. However, by essentially lowering the contrast of the mask, a decreased sensitivity to mask defects may be realized. Further benefits may accrue, especially when dealing with masks having a tremendously high contrast. Such downstream (of the mask) placement of the photochromic glass could also beneficially lower the cutoff frequency of the system.

Figure 4:
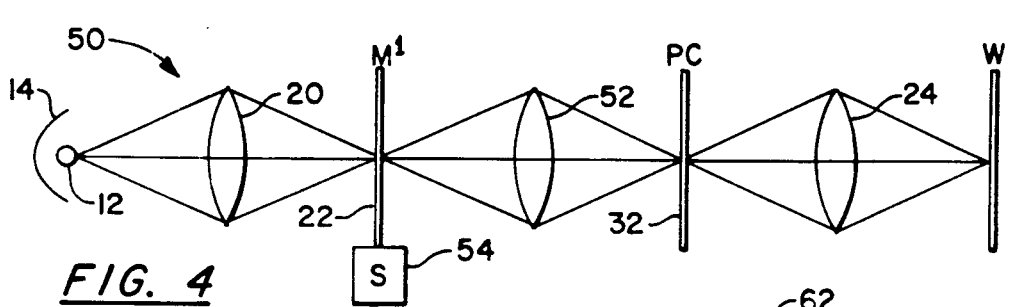
FIG. 4 is a simplified schematic representation of an alternate embodiment of photolithographic apparatus according to the present invention.

FIG. 4 shows yet another embodiment of the photolithographic apparatus 50 of the present invention. Although FIG. 4 shows the photochromic glass downstream of the mask, the technique illustrated by FIG. 4 is quite distinct from the previously described downstream embodiment of the invention.

In FIG. 4, in a manner similar to that discussed with respect to FIG. 2, the photolithography apparatus 50 includes a light source 12, optionally a reflector 14, a condensor lens 20 and a taking lens 24, and the mask 22 is disposed at the focal plane of the condensor lens. However, whereas in the embodiment of FIG. 2 both the photochromic glass 32 and the mask 22 were disposed at the focal plane of the condensor lens 20 (with the photochromic glass upstream but juxtaposed with the mask), in the embodiment of FIG. 4, only the mask is disposed at the focal plane of the condensor lens 20, and the photochromic glass is disposed downstream of the mask in the optical path. Further, an intermediate optic (lens) 52 is disposed in the light path between the mask and the photochromic glass. More particularly, the mask is disposed at the upstream focal point of the intermediate optic 52, and the photochromic glass is disposed at the downstream focal point of the intermediate optic 52. Further, the mask is disposed at the common focal point of the condensor lens 20 and the intermediate optic 52, and the photochromic glass is disposed at the common focal point of the intermediate optic 52 and the taking lens 24.

In the embodiment of FIG. 4, it is important that the intermediate optic 52 be a high resolution lens, for the following reasons.

What in effect will occur in the embodiment of FIG. 4 is that the mask will expose the photochromic glass, rather than the wafer (so long as the wafer is not in place). In other words the mask pattern will be imaged onto (actually into) the plane of the photochromic glass. With sufficient exposure, the mask will form a "virtual" image (of itself) on the photochromic glass. Ultimately, the photochromic glass, carrying the virtual image, is disposed in the optical path of photolithographic apparatus, in place of the mask, for exposing a semiconductor wafer (once the wafer is in place). With reference to FIG. 4, the photochromic glass could be exposed in the absence of the wafer, and then the virtually-imaged photochromic glass could be used to expose the wafer in the absence of the mask.

A benefit of employing the virtually imaged photochromic glass for exposure of the wafer is as follows. The mask has a hard chromium edge, and therefore is subject to extreme Fourier (diffraction) ringing. As the dimension of the mask becomes smaller and smaller, it becomes progressively more difficult to smooth the edges on the original mask plate. These relatively rough edges of the mask plate become more and more objectionable when they are being imaged into the image plane. However, the photochromic glass does not have a hard edge, and is therefore not subject to diffractive ringing. This follows from the fact that the photochromic glass is formed of an absorptive material, rather than of an opaque material such as the chromium of the mask.

Further benefits flow from creating a virtual image of the mask on the photochromic glass. Consider the case of a multiplicity of copies of a mask on a reticle. After exposing the photochromic glass to the image of a first mask, the reticle is stepped so that the photochromic glass is exposed to the second mask image. Then a third, and typically a fourth mask is imaged onto the photochromic glass. As will be more evident in FIG. 4A, slight misalignments between the multiplicity of mask images on the reticle will result in an averaged virtual image being created on the photochromic glass.

Prior art averaging techniques involve taking a reticle with up to four ("n") copies of a mask, putting the reticle on a reticle stage, illuminating one of the mask copies with one fourth (i.e., 1/n) of the nominal exposure, pushing (advancing) the reticle to the next step, illuminating the next mask copy, and so forth, until all of the mask copies have been used in sequence for imaging the wafer. All of these steps are involved for to obtain one image on each die of the wafer. A profound disadvantage of the prior art averaging technique is that it is practically limited to line widths of 1.2 microns and above because it is difficult to control the alignment of the reticle from mask-to-mask. In FIG. 4, the element 54 (S) represents the reticle stepper, which would include a reticle stage.

With the present invention, by imaging all of the masks of a reticle onto the photochromic glass, it is possible to create in the photochromic glass a single, semipermanent "copy" of the four (n) averaged mask images. Then, by using the semipermanent copy of the mask images, in effect as a virtual mask for exposing the wafer, it is possible to expose all of the die on the wafer before having to "pump up" (regenerate the virtual image) the photochromic glass again.

An important feature of the present inventive averaging technique is that the photochromic glass can be imaged off-line, such as in photolithographic apparatus including a reticle stepper (e.g., 54), and then the virtual mask (i.e., the image-averaged, exposed photochromic glass) can be used to expose a wafer in another photolithographic apparatus which may not include a reticle stepper. This feature alone can increase production line output capability. In another mode of employing the image-averaging technique of the present invention, with reference to FIG. 4, after exposing the photochromic glass to create the virtual mask (sans wafer), the image-averaged, exposed photochromic glass would simply be removed and relocated from its location between the intermediate optic 52 and the taking lens 24 and reinserted into the optical path between the condensing lens 20 and the intermediate optic 52 (in lieu of the mask) on the reticle stage (if there is one in the photolithographic apparatus) for exposing the wafer.

With prior art averaging techniques, a symmetrical (one-to-one) reticle (i.e., mask) is typically employed. A problem with such a "symmetrical" is that it is difficult to achieve critical dimension control, low distortion and low defects.

With the image averaging technique of the present invention, it is possible to use a reduction reticle, which is considerably larger (e.g., 2×, 4×, 5× or 10×) than prior art reticles. This solves another problem inherent in the prior art in that optical designs that are totally symmetrical tend to have different abheration sets than nonsymmetrical optics. For instance, a reduction optic can have better correction than symmetric optics. However, lack of symmetry dictates not only a higher required quality for the taking lens, but understandably will similarly dictate that a high quality intermediate optic 52 be employed.

Prior art averaging techniques are limited to line widths of about 1.2 microns, because of inherent misalignment between the successive masks on a reticle. In other words, misalignment between successively exposed masks will result in a line widths on the wafer greater than the individual mask line widths. The averaging technique of the present invention is practical for line widths of 0.4 microns, or better, for one reason because the hard surface diffractions of a mask are avoided. As will become evident with reference to FIG. 4A, a startling benefit of using the image-averaged photochromic glass as a virtual mask is that the line ultimately resulting on the wafer can actually be finer than those of the individual masks.

Figure 4A:
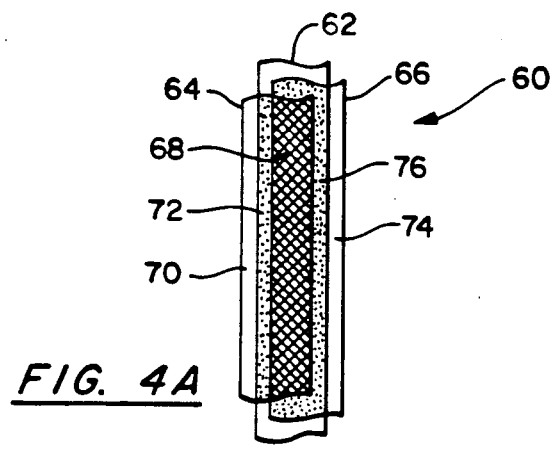
FIG. 4A is a simplified schematic representation of line images produced by the apparatus of FIG. 4.

FIG. 4A illustrates the image 60 that would be formed on (within) the photochromic glass 32 as a result of the above-described multi-exposure averaging technique of the present invention. Only three exposures are discussed, for descriptive clarity, although four would be more typical. (For any "averaging" technique, at least two exposures would be inherent.) In a first exposure (involving a first mask on a reticle having three masks), a first image 62 is formed on the photochromic glass. In a second exposure (involving a second mask on the reticle), a second image 64 is formed on the photochromic glass. In a third exposure (involving a third mask on the reticle), a third image 66 is formed on the photochromic glass. As shown in FIG. 4A, the three images 62, 64 and 66 overlap, but are out of registration with one another. More particularly, by way of example, the second image 64 is offset slightly to the left (one side) of the first image 62, and the third image 66 is offset slightly to the right (another side) of the first image 62.

In an area 68, the three images 62, 64 and 66 overlap. Hence, the area 68 receives the "full" exposure of all three images. In an area 70, only the first and second images 62 and 64, respectively, overlap. Hence, the area 70 receives only two-thirds of the full exposure (given that the exposure for all three images is equal). Similarly, in an area 72, only the first and third images 62 and 66, respectively, overlap. Hence, the area 72 receives only two-thirds of the full exposure. In an area 74, there is no overlap of images. Only the image 64 effects any exposure of the photochromic glass. Hence, the area 74 receives only one-third of the full exposure. Similarly, in an area 76, there is no overlap of images, and only the image 66 exposes the photochromic glass.

Consequently, the area 68 will be darkest area, the areas 70 and 72 will be the next darkest areas and the areas 74 and 76 will be the least darkest areas. Given the memory characteristics of photochromic glass described above, over time the lightest (least darkest) areas 74 and 76 will fade to below a threshold opacity required to effect patterning on the photoreactive layer of the wafer. Some time later, the areas of intermediate opacity (next darkest areas) 70 and 72 will fade to below the threshold opacity, and the darkest area 68 will still be opaque, above the opacity threshold. With proper selection of photochromic glass, some time after making the multiple exposures of images on the photochromic glass, a "window of opportunity" will arrive when the area 68 is opaque enough to be effective as a mask line, and the other areas 70–76 will be effectively transparent. During this opportunistic time period, the photochromic glass is effectively used as a virtual mask for exposing the wafer. Of course, the illumination levels (intensity and dosage) employed in creating the virtual mask on the photochromic glass versus those employed when using the photochromic glass as a virtual mask for exposing a wafer must be judiciously selected so that the virtual mask is not obliterated during wafer exposure. Typical photolithographic exposure times range on the order of tens to hundreds of milliseconds. It is well within the ambit of one of ordinary skill in the art to which the present invention pertains to make an appropriate selection of photochromic glass and illumination levels for imaging the glass and exposing the wafer, given the teachings of the present disclosure, to effect the averaging technique of the present invention.

A profound benefit of the above-described image averaging technique is that the area 68, which remains opaque during the wafer exposure process, is ultimately narrower in width than any of the original images 62, 64 or 66. Inasmuch as these images originally represented lines to be created on the wafer, it is evident that the virtual mask is capable of creating narrower lines on the wafer than could have been obtained with any of the original masks.

Whereas in the prior art, the ultimate line width would be as wide as the total left/right misalignment of the mask images, in the present invention, by using high memory glass, averaging and locking memory in various places, misalignments will fade over time to below a threshold, and effectively drop out. Consequently, finer lines and larger spacing between lines are obtainable.

In the prior art, the reticle is either moved between shots, or all of the wafers are exposed incompletely and run through the machine again for further exposures, both of which techniques are very time consuming. With the present invention, it is possible to do all (e.g., four) exposures of the masks onto one photochromic plate, without the wafer being in place. The photochromic plate "holds" the image for a period of time. For however long the photochromic plate is stable, shot (exposure) after shot after shot of the wafer could be performed, and it is quite possible that the entire wafer could be processed before the photochromic plate becomes corrupted (fades) enough that it has to be regenerated. This is a substantial benefit of the present invention, in that it is not necessary to move the reticle four times or move the wafer four times to process the wafer.

Although no particular benefit is envisioned, it should be understood that the above-described technique of exposing the photochromic glass to create a virtual mask would work with only one exposure.

What is claimed is:

1. Photolithographic apparatus comprising:
    a light source disposed at the upstream end of an optical path;
    means for locating a mask downstream from the light source in the optical path; and
    means for locating a semiconductor wafer downstream from the means for locating the mask in the optical path; and
    a photochromic glass interposed in the optical path upstream of the means for locating a mask between the light source and the means for locating the mask.

2. Photolithographic apparatus according to claim 1, further comprising:
    means for stepping a reticle containing a plurality of masks.

3. Photolithographic apparatus according to claim 1, wherein:
    the photochromic glass is interposed in the optical path in close juxtaposition with a mask disposed in the optical path.

4. Photolithographic apparatus according to claim 1, further comprising:
    a condensor lens disposed in the optical path upstream of the means for locating a mask; and an intermediate lens disposed between the mask and the condensor lens;

wherein the photochromic glass is disposed between the condensor lens and the intermediate lens.

5. Photolithographic apparatus according to claim 1, further comprising:

a condensor lens disposed in the optical path upstream of the means for locating a mask; and wherein the photochromic glass is coincident with the condensor lens.

6. Photolithographic apparatus according to claim 1, further comprising:

a taking lens disposed between the mask and the semiconductor wafer.

7. Photolithographic apparatus according to claim 1, further comprising:

a condensor lens disposed in the optical path upstream of the means for locating a mask.

8. Photolithographic apparatus according to claim 1, further comprising:

a uniformizer located in the optical path upstream of the photochromic glass in the optical path.

9. Photolithographic apparatus according to claim 1, further comprising:

an intermediate lens disposed in the optical path between the means for locating the mask and the photochromic glass.

10. Photolithographic apparatus according to claim 1, wherein:

the photochromic glass is disposed in a reflector behind the light source.

11. Photolithographic illuminator assembly for use with photolithographic apparatus having means for locating a mask, comprising:

a light source emitting light along a light path; and a photochromic glass disposed in the light path downstream of the light source and upstream of a mask.

12. Photolithographic illuminator according to claim 11, further comprising:

a condensor lens disposed between the light source and the photochromic glass.

13. Photolithographic illuminator assembly according to claim 11, further comprising:

a uniformizer interposed between the light source and the photochromic glass.

14. A method of performing photolithography on a semiconductor wafer comprising:

illuminating a semiconductor wafer with light from an illuminator, a light path being defined thereby;

disposing a mask in the light path between the illuminator and the wafer;

interposing a photochromic glass in the light path upstream of the mask between the illuminator and the mask.

15. A method according to claim 14, wherein:

the semiconductor wafer includes a layer of photoactive material; and the light is actinic light.

16. A method according to claim 15, wherein:

the photoactive material is photoresist.

17. A method according to claim 15, wherein:

the light is in the ultraviolet or near ultraviolet range.

18. A method according to claim 17, wherein:

the light has a wavelength of approximately 436 nanometers.

19. A method according to claim 17, wherein:

the light has a wavelength of approximately 365 nanometers.

20. A method according to claim 14, further comprising:

interposing a uniformizer in the light path between the illuminator and the photochromic glass.

21. A method according to claim 14, wherein:

the photochromic glass is interposed in the optical path in close juxtaposition with the mask.

22. A method according to claim 14, further comprising:

disposing a condensor lens in the optical path upstream of the mask; and disposing an intermediate lens between the mask and the condensor lens;

wherein the photochromic glass is disposed between the condensor lens and the intermediate lens.

23. A method according to claim 14, further comprising:

disposing a condensor lens in the optical path upstream of the mask; and wherein the photochromic glass is coincident with the condensor lens.

24. A method according to claim 14, further comprising:

disposing a taking lens between the mask and the semiconductor wafer.

25. A method according to claim 14, further comprising:

disposing a uniformizer in the optical path upstream of the photochromic glass.

26. A method according to claim 14, further comprising:

disposing a reticle containing a plurality of masks in the light path.

27. A method of photolithographically image-averaging a multiplicity of mask images onto a semiconductor wafer comprising:

exposing a stationary photochromic glass to a multiplicity of mask images to create a single virtual mask on the photochromic glass; and exposing a semiconductor wafer to an image projected by the single virtual mask.

28. A method according to claim 27, wherein:

the semiconductor wafer is exposed by the single virtual image on the photochromic glass within a period of time during which out of register mask images on the photochromic glass have faded to below a threshhold sufficient for effecting exposure of the semiconductor wafer.

29. A method of lowering mask contrast in photolithographic apparatus having an illuminator and a mask disposed downstream of the illuminator, comprising:

locating photochromic glass, of the type that is darkened when exposed to light, downstream of the mask and upstream of a wafer being exposed by the mask.

30. A method according to claim 29, further comprising:

disposing an intermediate lens in the optical path between the mask and the photochromic glass.

* * * * *